(12) United States Patent
Mayder

(10) Patent No.: US 7,750,650 B2
(45) Date of Patent: Jul. 6, 2010

(54) SOLID HIGH ASPECT RATIO VIA HOLE USED FOR BURN-IN BOARDS, WAFER SORT PROBE CARDS, AND PACKAGE TEST LOAD BOARDS WITH ELECTRONIC CIRCUITRY

(75) Inventor: Romi O. Mayder, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 433 days.

(21) Appl. No.: 11/685,866

(22) Filed: Mar. 14, 2007

(65) Prior Publication Data

US 2008/0100291 A1 May 1, 2008

Related U.S. Application Data

(60) Provisional application No. 60/863,071, filed on Oct. 26, 2006.

(51) Int. Cl.
G01R 1/02 (2006.01)
H01R 12/04 (2006.01)
(52) U.S. Cl. .................................. 324/754; 324/158.1
(58) Field of Classification Search ....................... None
See application file for complete search history.

(56) References Cited

U.S. PATENT DOCUMENTS

| 4,875,982 A | * | 10/1989 | Velie | 205/50 |
|---|---|---|---|---|
| 5,454,161 A | * | 10/1995 | Beilin et al. | 29/852 |
| 2006/0121722 A1 | * | 6/2006 | Card et al. | 438/622 |
| 2006/0180346 A1 | | 8/2006 | Knight et al. | |

OTHER PUBLICATIONS

"High-Aspect-Ratio Micromachining Via Deep X-Ray Lithography" by H. Guckel, Aug. 1998, pp. 1586-1593.*

* cited by examiner

*Primary Examiner*—Paresh Patel
(74) *Attorney, Agent, or Firm*—Holland & Hart, LLP

(57) ABSTRACT

A method, and apparatus resulting from the method, for fabricating a circuit board suitable for mounting electronic components. The method includes drilling a plurality of through-holes in a plurality of dielectric sheets, forming a conductive film on at least one side of each of the plurality of dielectric sheets, and substantially filling each of the plurality of through holes with a conductive material. The conductive material is both electrically and thermally uninterrupted from a first face to a second face of each of the plurality of dielectric sheets. The plurality of dielectric sheets are then sequentially mounted, on atop another, to form the circuit board. The sequential mounting step is performed after the steps of drilling the plurality of through-holes, forming the conductive layer, and substantially filling the plurality of through-holes.

9 Claims, 2 Drawing Sheets

Fig._1 (Prior Art)

SOLID HIGH ASPECT RATIO VIA HOLE USED FOR BURN-IN BOARDS, WAFER SORT PROBE CARDS, AND PACKAGE TEST LOAD BOARDS WITH ELECTRONIC CIRCUITRY

CROSS-REFERENCE TO RELATED APPLICATIONS

This application claims priority from U.S. Provisional Patent Application Ser. No. 60/863,071 entitled "Solid High Aspect Ratio Via Hole Used For Burn-In Broads, Wafer Sort Probe Cards, and Package Test Load Boards with Electric Circuitry" filed Oct. 26, 2006 which is hereby incorporated by reference in its entirely.

TECHNICAL FIELD

The present invention is related generally to fabrication of mounting structures (e.g., printed circuit or wiring boards) for electronic devices. More specifically, the present invention is related to a fabrication technique for producing high aspect ratio via holes in the mounting structures.

BACKGROUND

For application that require a printed circuit board (PCB) with a plurality of layers and a high density of interconnects, via holes have traditionally been fabricated by mechanically drilling a series of holes through the plurality of layers and then plating the holes with low resistivity metals. However, plating a long and narrow via hole has proven to be problematic. In order to have a sufficiently uninterrupted metal layer deposited within the via hole, aspect ratios (i.e., board thickness to hole diameter) have typically been limited to 15:1 for high volume, low cost PCBs and 36:1 for low volume, high cost PCBs. As packaging technology continues to advance and the pitch between electrical pads coupled to ends of the plated vias decreases, there is a need to substantially increase the aspect ratio of via holes even further.

This need is particularly true in the automated test equipment (ATE) industry for burn-in boards used for burn-in test, load boards used for package test, and probe cards used for wafer test. Probe cards, in particular, often require a 50:1 or 75:1 aspect ratio via hole for the 50 or more layers needed to internally route the PCBs. Thus, probe cards are extremely expensive owing in part to the layer and high aspect ratio requirements. In order to further reduce the cost of testing in ATE systems, more devices must be tested in parallel. As more devices are tested in parallel, more routing layers are needed to route electrical test signals to and from devices under test (DUTs). Consequently, the aspect ratio of the PCBs must be substantially increased beyond a 36:1 ratio. The increased routing layers results in an overall increase in thickness of the board.

Various methods of producing multilayered PCBs are known in the art. A commonplace production technique in the manufacture of some printed circuit boards is to form printed circuitry on both sides of a planar rigid or flexible insulating substrate. In addition, such boards also typically include several parallel and planar alternating inner layers of insulating substrate material and conductive metal. Exposed outer sides of the laminated structure are typically provided with circuit patterns and metal inner layers typically contain circuit patterns.

Conductive interconnections are provided between the various conductive layers or sides of the board in multilayered PCBs. The interconnections are commonly achieved by providing metallized conductive holes (i.e., conductive vias; also referred to in the printed circuit field as plated thru-holes or PTHs) in the board which communicate with faces and layers requiring electrical interconnection.

Typically, thru-holes are drilled (by mechanical or laser drilling means) or punched into or through the board at desired locations. Drilling or punching provides newly-exposed surfaces including via barrel surfaces and via peripheral entry surfaces. The dielectric substrate, comprising a top surface, a bottom surface, and at least one exposed via hole surface, consisting partly or entirely of insulating materials, is then metallized, generally by electroless metal depositing techniques, albeit other deposition processes are also known in the field.

When mechanically drilling a via hole through a board, care must be taken not to unintentionally drill through metallization layers that are not intended to be electrically connected to the via. Controlling the drill location within the layers of the PCB has proven to be difficult. As a result of the difficulty, large anti-pads must be created in internal and external layers of the PCB. The large anti-pads prevent inadvertent contact with particular metal layers but also limit electrical performance of the signals and create crosstalk for tight pitch devices. Further, the large anti-pads limit an overall surface density of vias.

With reference to FIG. 1, an enlarged section of a prior art PCB board 100 demonstrates difficulties encountered in contemporary via production. The prior art PCB includes a plurality of dielectric sheets 101. The dielectric sheet 101 material is usually comprised of an organic material such as fiberglass-reinforced epoxy resin (e.g., FR-4), polytetrafluoroethylene (e.g., Teflon®, a trademark of E.I. du Point De Nemours & Co., Wilmington, Del.), Driclad® (a trademark of Endicott Interconnect Technologies, Inc., Endicott, N.Y.), and similar materials known to one of skill in the art. Since the plurality of dielectric sheets 101 are nonconductive they are typically "seeded" and plated with a copper conductive layer 103. After the copper conductive layer 103 and other conductive traces or routings (not shown) are produced, each of the plurality of dielectric sheets 101 is laminated together. After lamination, a via hole 105 is mechanically drilled through the stacked plurality of dielectric sheets 101. To avoid any electrical contact between the copper conductive layers 103 and the via hole 105, large non-conductive anti-pads 107, produced on each sheet 101 prior to lamination, prevent unintended electrical communications. A conductive via plating 109 ideally is uninterrupted on sidewalls of the via hole 105 to permit electrical communications between upper and lower surfaces of the PCB 100. However, as the aspect ratio of the via 105 increases, production of an uninterrupted conductive via plating 109 becomes problematic. Therefore, as shown in FIG. 1, interrupted conductive via plating 109 may be present in via 105.

Therefore, what is needed is a simple, economical, and robust means of producing vias in PCBs which have high aspect ratio vias which are fully uninterrupted electrically, and require no large are anti-pads.

SUMMARY OF THE INVENTION

In an exemplary embodiment, the present invention is a method for fabricating a circuit board suitable for mounting electronic components. The method includes drilling a plurality of through-holes in a plurality of dielectric sheets, forming a conductive film on at least one side of each of the plurality of dielectric sheets, and substantially filling each of the plurality of through holes with a conductive material. The conductive material is both electrically and thermally uninterrupted from a first face to a second face of each of the plurality of dielectric sheets. The plurality of dielectric sheets are then sequentially mounted, one atop another, to form the circuit board. The sequential mounting step is performed after the steps of drilling the plurality of through-holes, forming the conductive layer, and substantially filling the plurality of through-holes.

In another exemplary embodiment, the present invention is a method for fabricating a probe card suitable for mounting electronic components. The method includes drilling a plurality of through-holes in a plurality of dielectric sheets and forming a conductive film on at least one side of each of the plurality of dielectric sheets. The conductive film is arranged to define electrical traces. Each of the plurality of through holes is substantially filled with a conductive material. The conductive material is electrically and thermally uninterrupted from a first face to a second face of each of the plurality of dielectric sheets. Each of the plurality of dielectric sheets is sequentially mounted, one atop another, to form the probe card. The sequential mounting step is performed after the steps of drilling the plurality of through-holes, forming the conductive layer, and substantially filling the plurality of through-holes. The probe card is fabricated to allow mounting into an automated test equipment system.

In another exemplary embodiment, the present invention is a probe card for mounting into an automated test equipment system where the probe card comprises a plurality of dielectric sheets. Each of the plurality of dielectric sheets has a conductive film on at least one face thereof where the conductive film is arranged to define electrical traces. Each of the plurality of dielectric sheets further has a plurality of through-holes contained therein where the plurality of through-holes are substantially filled with an electrically conductive material with at least one of the plurality of through-holes arranged to traverse the probe card and having an aspect ratio of least 50:1.

DETAILED DESCRIPTION

Various embodiments described herein present a novel method, and resulting PCB and probe card, for fabricating high aspect ratio via holes to replace conventionally produced mechanically-drilled or laser-drilled vias drilled subsequent to lamination of various layers. In ATE applications, high aspect ratio via holes of the present invention allow high density and tight pitch placement required for testing today's various electronic devices such as high density integrated circuit memory devices.

Figure 1:
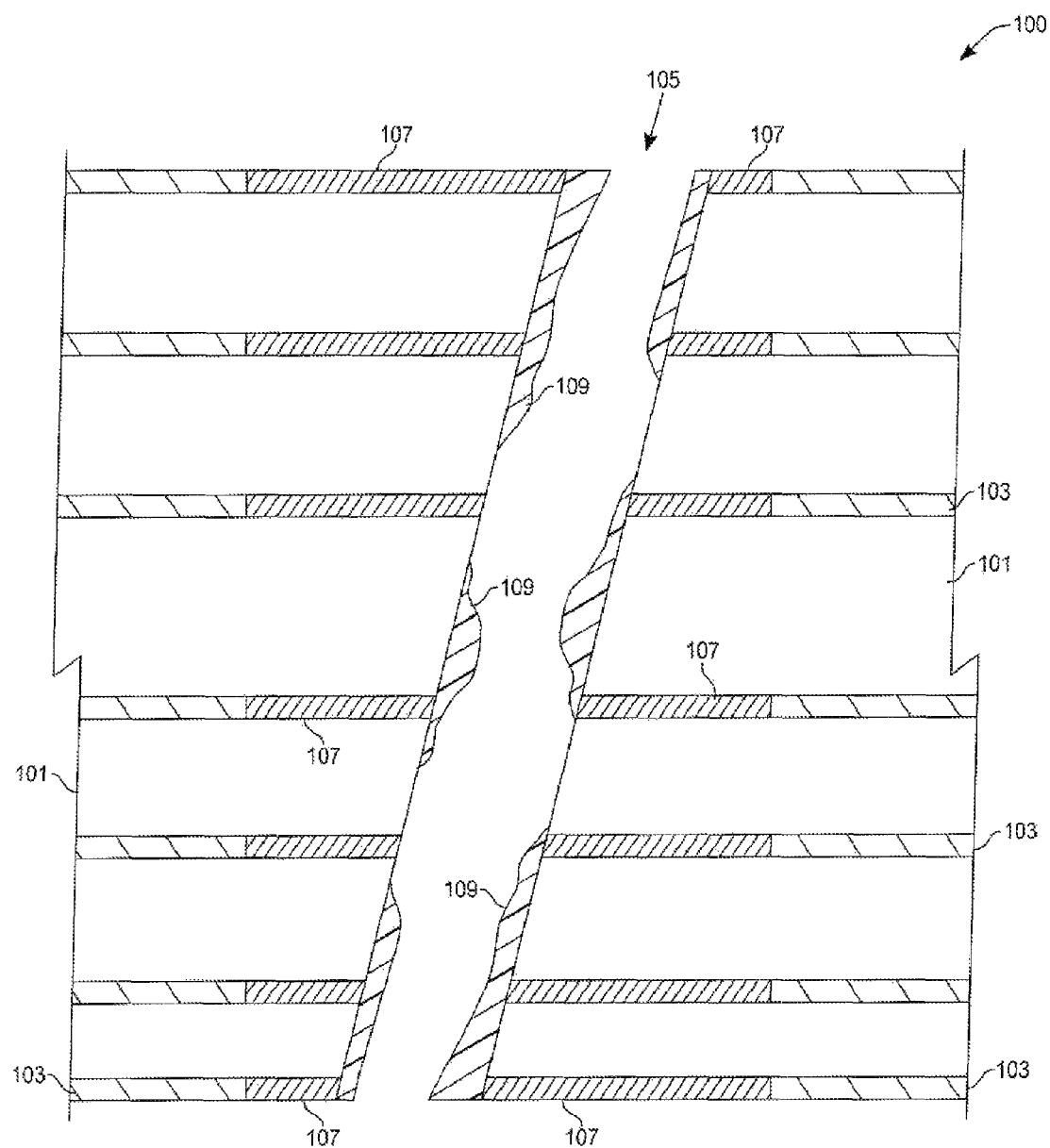
FIG. 1 is a cross-sectional view of a section of a printed circuit board having a plurality of layers and a plated via.
Figure 2:
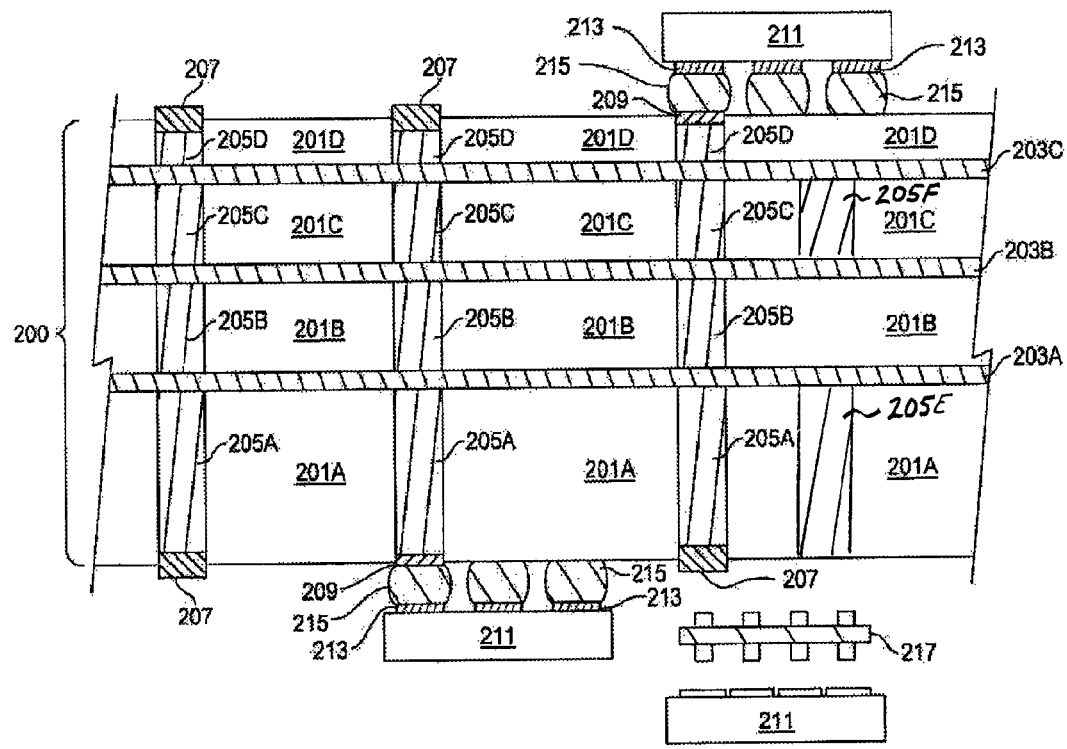
FIG. 2 is an exemplary cross-sectional view of a PCB in accord with an embodiment of the present invention.

With reference to FIG. 2, a completed exemplary printed circuit board 200 includes a plurality of dielectric sheets 201A-201D. Each of the plurality of dielectric sheets 201A-201D may be comprised of, for example, any of the organic materials known in the art. Additionally, DiClad, CuClad and others (available from Arlon-MED, Rancho Cucamonga, Calif.), Park-Nelco 4000-13 (available from Park Electrochemical Corporation., Anaheim, Calif.), Rogers 3000/4000, Duroid® and (available from Rogers Corporation, Rogers Conn.), Duraver® and others (available from Isola GmbH, Dueren, Germany) and other materials may all be employed. Each of the plurality of dielectric sheets 201A-201D may be formed from other rigid, semi-rigid, and flexible electrically insulative materials as well. Additionally, each of the plurality of dielectric sheets 201A-201D may be comprised of materials different from an adjacent layer.

A layer of conductive plating 203A-203C is applied to one or both faces of the plurality of dielectric sheets 201A-201D. Note that, for example, the top conductive plating layer 203C may actually be comprised of two different layers, one on an uppermost surface of the third dielectric sheet 201C and another on the lower surface of the fourth dielectric sheet 201D. The layer of conductive plating 203A-203C may be a continuous conductive layer. Alternatively, the layer of conductive plating 203A-203C may be a patterned layer forming electrical routing traces. Each of the plurality of dielectric sheets 201A-201D may be of formed from materials of different thicknesses and each layer of conductive plating 203A-203C may be optimized in thickness for a given application. For example, a ground or power layer may require a thicker conductive plating than a high frequency, low current data signal. Also, each layer of conductive plating 203A-203C may be comprised of a different conductive material such as copper, nickel, tantalum, tungsten, titanium, gold and other conductive materials known in the art depending upon electrical and thermal needs for a particular layer.

Unlike fabrication techniques employed in the prior art, each of the plurality of dielectric sheets 201A-201D has a plurality of holes drilled (e.g., by mechanical or last drilling techniques, known in the art) and substantially filled prior to lamination to form the exemplary printed circuit board 200. If needed to provide electrical isolation, small anti-pads (not shown) may be added to one or more faces of a dielectric sheet. Once the plurality of via holes are drilled, they are either fully or substantially filled with a conductive material thus forming substantially filled conductive vias 205A-205D. A substantial fill will be sufficient to assure both thermal and electrical continuity between each end of the substantially filled conductive vias 205A-205D. The conductive material may include individual materials or combinations of materials such as copper, titanium, tungsten, tantalum and other conductive materials known in the art. Blind or buried vias 205E, 205F may also be fabricated using this technique by drilling only through one or more of the plurality of dielectric sheets 201A-201D prior to lamination.

In addition to being excellent electrical conductors, the substantially filled conductive vias 205A-205D are also excellent thermal conductors. The conductive vias 205A-205D constructed as described herein conduct heat better than prior art via holes which are made with silver epoxy or copper epoxy, even if the prior art holes could be fully filled. As an example, solid copper has a thermal conductivity of 400 W/m·K while silver epoxy has a thermal conductivity of 2 W/m·K and copper epoxy has a thermal conductivity of 1 W/m·K. Due to the high thermal conductivity of the conductive vias 205A-205D, the printed circuit board 200 may mate to a thermal water block (not shown) to dissipate heat generated in and around the PCB 200. In such a case, the conductive vias 205A-205D act as low impedance thermal paths for heat to conduct from one side of the PCB 200 to the other. If the printed circuit board 200 is air cooled, the conductive vias 205A-205D act as conductive/convective heat sinks removing heat from the printed circuit board 200.

Assembly of the exemplary printed circuit board 200 may be completed once each of the plurality of dielectric sheets 201A-201D has received a conductive plating 203A-203C and the conductive vias 205A-205D are substantially filled. Each of the plurality of dielectric sheets 201A-201D are sequentially laminated.

In a specific exemplary embodiment, the exemplary printed circuit board 200 is fabricated from two types of dielectric (not shown). One dielectric is referred to as a prepreg and the other dielectric is referred to as a core. The prepreg is comprised of the same material composition as the core but has not been fully cured (i.e., hardened). First, a layer of copper is deposited on both sides of the core material by, for example, sputtering. Secondly, the deposited copper is patterned on both sides by use of a traditional photolithography process. Via holes are drilled (e.g., mechanically formed or by laser ablation) through the core followed by a subsequent plating/filling of the drilled via holes thus electrically connecting opposing layers of copper on the core. A layer of copper is deposited on one side of the prepreg material. The prepreg copper layer is then patterned and via holes are drilled.

In this specific exemplary embodiment, lamination of the prepreg to the core layer is accomplished by first aligning fiducial marks on each layer to an opposing layer (the materials are semi-translucent). The two layers are laminated together by an application of heat and pressure (e.g., approximately 300° C. at 170 kPa (about 25 psig)) wherein the prepreg starts to flow and acts as an epoxy. The patterned copper image of the core material sinks into the prepreg and bonds. The copper image on the core material displaces prepreg material which flows to the outer edges of the panel. Excess prepreg material may be cut off after the last lamination step. Vias of the prepreg side are then plated thus making electrical contact with underlaying traces on the core layer. The procedure is repeated as many times as needed to build up a multi-layer printed circuit broad.

Although only four individual layers are shown in FIG. 2, fabrication techniques described herein are readily applicable to printed circuit boards containing 80 or more layers. For example, a 0.4 mm pitch (in both x- and y-directions) having via holes with an aspect ratio of 75:1 in a completed 0.375" thick PCB with 80 layers has been produced by methods provided herein. Also, by substantially filling each of the via holes, solder is prevented from being wicked into the hole during subsequent mounting of electronic components on surfaces of the completed PCB.

With continued reference to FIG. 2, in a specific exemplary embodiment, outer layers of the exemplary printed circuit board 200 are plated with nickel (not shown) to cover any surface imperfections that my have been created by the sequential lamination process. Nickel plating processes are known in the art. Since the vias have been made flat on the outer layers by use of the nickel plating process, the vias will have a large flat surface area that may be mated to a water block as described above. The heat generated by the devices on the PCB can now be removed more efficiently owing to enhanced thermal conductivity achievable through the smoothed surface.

After plating with nickel, a two step gold plating process may be used. First, gold is deposited over all exposed ends of the vias 205A, 205D of the PCB 200 to a thickness of, for example, about 125 nanometers (i.e., approximately 5 μin). The set of solderable contact points 209 are masked with photoresist to prevent any additional gold plating. Remaining exposed contact points receive additional plating for a total gold thickness of about 1.25 μm (approximately 50 μin) forming a set of thickly plated contact points 207. Hence, depending on the application of the via hole, a particular thickness of gold is plated allowing each via hole metallization to be optimized independent of a neighboring via. Alternatively, the conductive vias 205A-205D may be directly soldered, with or without a dog bone trace, and with or without a solder pad.

For example, the set of solderable contact points 209 plated with 125 nanometers of gold may be used to mount a plurality of integrated circuit devices 211. A plurality of device pads 213 on the integrated circuit devices 211 provide electrical contact points to which contact devices may be mounted. The contact devices may include solder bass/solder paste 215 or balls from a ball grid array (BGA) or contacts from other package types. A mechanical interface 217, such as an interposer or socket, may be used to mount the integrated circuit devices 211 to the printed circuit board 200 through the set of thickly plated contact points 207.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, a skilled artisan will recognize that alternative techniques and methods may be utilized to plate or deposit certain layers described herein. The alternative techniques and methods are still included within a scope of the appended claims. For example, there are frequently several techniques used for forming a material in additional to plating (e.g., chemical vapor deposition, plasma-enhanced vapor deposition, epitaxy, atomic layer deposition, sputtering, etc.). Although not all techniques are amenable to all material types described herein, one skilled in the art will recognize that multiple methods for fabricating a material may be used. Also, various alloys, compounds, and multiple layers of stacked materials may be used, such as with conductive materials formed within the vias. These and various other embodiments and techniques are all within a scope of the present invention. The specification and drawings are, accordingly, to be regarded in an illustrative rather than a restrictive sense.

What is claimed is:

1. A probe card for mounting into an automated test equipment system, the probe card comprising a plurality of dielectric sheets, each of the plurality of dielectric sheets having a conductive film on at least one face thereof, the conductive film arranged to define electrical traces, each of the plurality of dielectric sheets further having a plurality of through-holes contained therein, the plurality of through-holes being substantially filled with an electrically conductive material, at least one of the plurality of filled through-holes of each dielectric sheet being aligned to define at least one via arranged to traverse the probe card and having an aspect ratio of at least 50:1, wherein at least one of the conductive films intersects the via.

2. The probe card of claim 1 wherein the conductive material is copper.

3. The probe card of claim 1 wherein the conductive material is comprised of both titanium and tungsten.

4. The probe card of claim 1 wherein each of the plurality of dielectric sheets is comprised of an organic material.

5. The probe card of claim 1 wherein each of the plurality of dielectric sheets is comprised of a rigid material.

6. The probed card of claim 1 wherein one or more of the plurality of through-holes is arranged so as to form a blind via.

7. The probe card of claim 1 wherein one or more of the plurality of through-holes is arranged so as to form a buried via.

8. The probe card of claim 1 wherein at least one of the plurality of through-holes is arranged to traverse the probe card and has an aspect ratio of least 75:1.

9. A probe card configured for use with an automated test equipment system, the probe card comprising:
- a plurality of dielectric sheets, each dielectric sheet having a plurality of through-holes contained therein, the plurality of through-holes being substantially filled with an electrically conductive material, at least one through-hole of each dielectric sheet being aligned to define a via that extends between opposing side surfaces of the probe card, the via having an aspect ratio of least 50:1;
- a conductive film positioned on at least one face of each dielectric sheet, the conductive films defining electrical traces, at least one of the conductive films intersecting the via.

* * * * *

UNITED STATES PATENT AND TRADEMARK OFFICE
CERTIFICATE OF CORRECTION

| | | |
|---|---|---|
| PATENT NO. | : 7,750,650 B2 | Page 1 of 1 |
| APPLICATION NO. | : 11/685866 | |
| DATED | : July 6, 2010 | |
| INVENTOR(S) | : Mayder | |

It is certified that error appears in the above-identified patent and that said Letters Patent is hereby corrected as shown below:

On title page

In the Cross-Reference to Related Applications, Column 1, Line 12, "Boards with Electric" should read --Boards with Electronic--.

Column 3, Line 65, "and (available from Rogers Corporation, Rogers Conn.)" should read --and others (available from Rogers Corporation, Rogers Conn.)--.

Column 6, Line 10, "solder bass/solder paste" should read --solder balls/solder paste--.

Signed and Sealed this

Sixteenth Day of November, 2010

David J. Kappos
*Director of the United States Patent and Trademark Office*